US006551871B2

United States Patent
Takamura

(10) Patent No.: US 6,551,871 B2
(45) Date of Patent: Apr. 22, 2003

(54) PROCESS OF MANUFACTURING A DUAL GATE CMOS TRANSISTOR

(75) Inventor: Yoshiji Takamura, Uda-gun (JP)

(73) Assignee: Sharp Kabushiki Kaisha, Osaka (JP)

( * ) Notice: Subject to any disclaimer, the term of this patent is extended or adjusted under 35 U.S.C. 154(b) by 28 days.

(21) Appl. No.: 09/829,068

(22) Filed: Apr. 10, 2001

(65) Prior Publication Data

US 2002/0042173 A1 Apr. 11, 2002

(30) Foreign Application Priority Data

May 19, 2000 (JP) .................................... 2000-148053

(51) Int. Cl.[7] ......................................... H01L 21/8238
(52) U.S. Cl. ....................... 438/223; 438/222; 438/224; 257/371
(58) Field of Search ................................ 438/222, 223, 438/224; 257/371

(56) References Cited

U.S. PATENT DOCUMENTS 4,935,804 A * 6/1990 Ito et al. ..................... 257/476
5,973,370 A * 10/1999 Nayak et al. ................ 257/369
6,096,614 A * 8/2000 Wu ............................ 257/408
6,140,187 A * 10/2000 DeBusk et al. ............. 438/216
6,342,438 B2 * 1/2002 Yu et al. ..................... 438/520
6,372,618 B2 * 4/2002 Forbes et al. ............... 438/589
6,380,055 B2 * 4/2002 Gardner et al. ............. 438/560
2002/0014660 A1 * 2/2002 Noble et al. ................ 257/346
2002/0045342 A1 * 4/2002 Hu et al. .................... 438/656

FOREIGN PATENT DOCUMENTS

| JP | 6-310666 | 11/1994 |
| JP | 11-297852 | 10/1999 |
| JP | 11-307765 | 11/1999 |

* cited by examiner

Primary Examiner—Richard Elms
Assistant Examiner—Christian D. Wilson
(74) Attorney, Agent, or Firm—Nixon & Vanderhye P.C.

(57) ABSTRACT

A process of manufacturing a semiconductor device having a dual gate CMOS transistor in which an nMOS transistor in the dual gate CMOS transistor is formed by the steps of: (a) forming a gate insulating film and a silicon film on a semiconductor substrate; (b) implanting n-type impurities into the silicon film in an nMOS region of the semiconductor substrate; (c) forming a conductive film on the silicon film; and (d) patterning the silicon film and the conductive film into a gate electrode.

18 Claims, 3 Drawing Sheets

PROCESS OF MANUFACTURING A DUAL GATE CMOS TRANSISTOR

CROSS-REFERENCE TO RELATED APPLICATION

This application is related to Japanese application No. 2000-148053 filed on May 19, 2000, whose priority is claimed under 35 USC §119, the disclosure of which is incorporated by reference in its entirety.

BACKGROUND OF THE INVENTION

1. Field of the Invention

The present invention relates to a process of manufacturing a semiconductor device. In particular, it relates to a process of manufacturing a semiconductor device having a miniaturized dual gate CMOS transistor.

2. Description of Related Art

In a trend to miniaturization of MOS transistors due to development of semiconductor processing techniques, a dual gate CMOS transistor has generally been applied since it inhibits short channel effect and reduces OFF current. The dual gate CMOS transistor utilizes an n-type polysilicon file and a p-type polysilicon film as gate electrodes of an nMOS transistor and a pMOS transistor, respectively.

In the dual gate CMOS transistor, the gate electrode is implanted with n- or p-type impurities by ion implantation for forming a shallow junction as a source/drain region. Accordingly, the impurities are not sufficiently introduced into the neighborhood of a gate insulating film and depletion occurs in the gate electrode, which deteriorates transistor properties.

Further, in the formation of the pMOS transistor, $BF_2$ ions are generally implanted to form a source/drain region of a shallow junction. Boron ions introduced into the gate electrode tends to cause enhanced diffusion in the gate insulating film due to the presence of fluorine and penetrates the gate insulating film to diffuse into a channel region, which varies a threshold value of the transistor. The current MOS transistor utilizes a gate insulating film which is as very thin as several tens of Å and it tends to be further thinned due to the miniaturization of the MOS transistor. Therefore it is considered that the penetration of boron ions through the gate insulating film will occur more remarkably.

Japanese Unexamined Patent Publication No. HEI 6 (1994)-310666 has proposed a method of preventing the depletion of the gate electrode as described below.

As shown in FIG. 3(a), a p-well 52a and an n-well 52b are formed in a nMOS region and an pMOS region, respectively by ion implantation in a semiconductor substrate 50 provided with device isolation films 51.

Then, a gate insulating film 53 and a silicon film 54 are formed on the semiconductor substrate 50 as shown in FIG. 3(b) and n- and p-type impurities are implanted to the nMOS region and the pMOS region, respectively. The obtained semiconductor substrate is then annealed to form an n-type polysilicon film 54a and a p-type polysilicon film 54b as shown in FIG. 3(c).

Further, the n-type polysilicon film 54a and the p-type polysilicon film 54b are patterned into a desired configuration to form gate electrodes as shown in FIG. 3(d). Ion implantation is then performed to form LDD regions 56a and 56b in the nMOS region and the pMOS region, respectively. Then an insulating film is deposited on the entire surface of the semiconductor substrate 50 and etched back to form sidewall spacers 55 onto the gate electrodes.

With the sidewall spacers 55 and the gate electrodes as a mask, ion implantation is carried out to the nMOS region and the pMOS region, respectively, and annealing is performed to form source/drain regions 57a and 57b as shown in FIG. 3(e).

Thereafter, a titanium film is formed on the resulting semiconductor substrate 50 and thermally treated to provide a titanium silicide film 58 on the source/drain regions 57a and 57b and the gate electrodes. An interlayer insulating film 59 and contact holes are provided and then contact plugs 60 and a wiring layer 61 are formed by a wiring process.

In summary, a resist mask is formed in advance by photolithography before the formation of the gate electrode, with which suitable ions are implanted to the polysilicon films in the nMOS region and the pMOS region, respectively, and then annealed to obtain the nMOS transistor and the pMOS transistor.

Through these steps, impurities are sufficiently introduced into the gate electrodes in the neighborhood of the gate insulating film and the depletion of the gate electrodes is prevented.

In the above-mentioned method, however, an additional photolithography step has to be carried out for ion implantation to the gate electrodes. Further, annealing has to be carried out for a relatively long period or in plural times in order to diffuse the impurities from the surface of the gate electrode to an interface between the gate electrode and the gate insulating film. Accordingly, manufacturing steps are increased and lengthened, which leads to an increase of production costs.

The depletion of the gate electrode can be prevented by thinning the polysilicon film consisting the gate electrode or increasing a dose and an acceleration energy for ion implantation for forming the source/drain region. However, the former may increase the amount of boron ions penetrating the gate insulating film or deteriorate the gate insulating film due to stress applied by a salicide step. The latter may lead short channel effect and increase junction leak current caused by defects of the semiconductor substrate due to ion implantation as well as promote the penetration of boron ions through the gate insulating film particularly in the pMOS transistor.

Further, Japanese Unexamined Patent Publication No. HEI 11(1999)-307765 has proposed a method of avoiding multiplication of the photolithography steps. According to this method, a polysilicon film of large particle diameter doped with phosphorus is formed on the entire surface of a semiconductor substrate and a non-doped polysilicon film is formed thereon. These polysilicon films are patterned to form gate electrodes. Thereafter, at the ion implantation for forming a source/drain region, phosphorus previously doped as n-type impurities are compensated by p-type impurities of high concentration to provide a p-type gate electrode in the pMOS region.

However, when the p-type impurities are implanted in a dose capable of preventing the depletion of the gate electrode, inhibition of short channel effect becomes insufficient as this method involves eliminating the n-type impurities and giving p-type conductivity to the gate electrode by the ion implantation for forming the source/drain region.

This method may prevent the depletion of the gate electrode by annealing at high temperature and/or for a long time to activate the impurities. However, the method is still problematic in that the impurity diffusion in the source/drain region is enhanced, and short channel effect and penetration of boron ions through the gate insulating film in the pMOS transistor remarkably occur.

The penetration of boron ions through the gate insulating film can be inhibited by performing the ion implantation for forming the source/drain region with boron ions free from fluorine. However, the use of boron ions makes the formation of a shallow source/drain region difficult, so that short channel effect cannot be prevented and OFF current increases.

It may be possible to inhibit the penetration of boron ions by using amorphous silicon as a gate electrode material instead of polysilicon, utilizing polysilicon of large particle diameter as proposed in Japanese Unexamined Patent Publication No. HEI 11(1999)-297852, or providing an extremely thin insulating film at an interface within a multilayered silicon film. However, impurity diffusion in the gate electrode is hindered and therefore the depletion of the gate electrode easily occurs.

Thus, in the present situation, there has not been established yet a method which allows all the requirements for prevention of short channel effect, reduction of OFF current, inhibition of depletion of the gate electrode and prevention of penetration of boron ions through the gate insulating film in a miniaturized dual gate CMOS transistor.

SUMMARY OF THE INVENTION

The present invention has been achieved in view of the above-mentioned problems. An objective of the present invention is to provide a process of manufacturing a semiconductor device including a miniaturized dual gate CMOS transistor of high performance and high reliability, the method being capable of preventing the short channel effect, reducing the OFF current, inhibiting the depletion of the gate electrode and preventing the penetration of boron ions through the gate insulating film, without multiplying and lengthening the manufacturing steps.

According to the present invention, provided is a process of manufacturing a semiconductor device having a dual gate CMOS transistor in which an nMOS transistor in the dual gate CMOS transistor is formed by the steps of: (a) forming a gate insulating film and a silicon film on a semiconductor substrate; (b) implanting n-type impurities into the silicon film in an nMOS region of the semiconductor substrate; (c) forming a conductive film on the silicon film; and (d) patterning the silicon film and the conductive film into a gate electrode.

Further, the present invention provides a process of manufacturing a semiconductor device having a dual gate CMOS transistor comprising the steps of: (a) forming a gate insulating film and a silicon film on a semiconductor substrate; (b') implanting n-type impurities into the silicon film in an nMOS region and p-type impurities into the silicon film in an pMOS region of the semiconductor substrate; (c) forming a conductive film on the silicon film; and (d') patterning the silicon film and the conductive film into gate electrodes for the nMOS and pMOS transistor.

These and other objects of the present application will become more readily apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

DESCRIPTION OF THE PREFERRED EMBODIMENTS

Figure 1A:
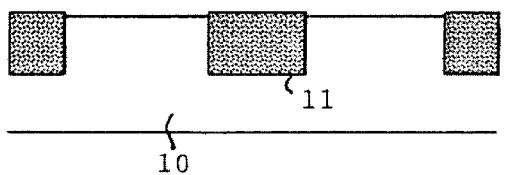
FIGS. 1(a) to 1(i) are schematic sectional views of a major part for illustrating an embodiment of a process of manufacturing a semiconductor device according to the present invention.

The present invention relates to a process of manufacturing a dual gate CMOS transistor. Mainly the process, for forming an nMOS transistor in the dual gate CMOS transistor, includes the steps of: (a) forming a gate insulating film and a silicon film on a semiconductor substrate; (b) implanting n-type impurities in the silicon film in an nMOS region of the semiconductor substrate; (c) forming a conductive film on the silicon film; and (d) patterning the silicon film and the conductive film into a gate electrode.

As the semiconductor substrate used in the process of the present invention, various kinds of substrate can be applied, for example, element semiconductor substrates such as of silicon, germanium and the like, compound semiconductor substrates such as of GaAs, InGaAs and the like, SOI substrates and multilayer SOI substrates. Among them, the silicon substrate is preferable. The semiconductor substrate may be combined with semiconductor elements such as transistors and capacitors; circuits thereof; wiring layers; device isolation films such as a LOCOS film, a trench device isolation film and an STI (shallow trench isolation) film; and insulating films formed thereon.

In the present invention, a gate insulating film and a silicon film are formed in the step (a).

There is no particular limitation to material and thickness of the gate insulating film as long as they are generally applied to semiconductor devices. For example, a single-layered or multi-layered silicon oxide film, silicon nitride film and the like are usable. The thickness thereof may be about 2 to 7 nm, for example. The gate insulating film may be formed by a known method, e.g., a thermal oxidization, a CVD method or the like.

The silicon film is preferably formed of silicon such as polysilicon and amorphous silicon. Various kinds of method such as a known method, a CVD method and an epitaxial growth may be used to form the silicon film. The thickness of the silicon film is not particularly limited but consideration should be given to inhibition of penetration of impurities to the semiconductor substrate at ion implantation thereof and optional ion implantation to the semiconductor substrate through the silicon film. Specifically, the thickness of the silicon film may be about 40 to 100 nm if it is made of polysilicon or amorphous silicon.

Before the formation of the gate insulating film and the silicon film, an n-well may be formed only in a pMOS region of the semiconductor substrate. The n-well is provided by forming a protective film at least on a surface of the pMOS region and implanting n-type impurities (e.g., phosphorus, arsenic and antimony) into the semiconductor substrate through the protective film. The protective film is not particularly limited as long as its material and thickness allow protecting the surface of the semiconductor substrate against the ion implantation. For example, an insulating film made of a single-layered or multi-layered silicon oxide film, silicon nitride film and the like is usable. The thickness may be about 5 to 20 nm, for example. Conditions for the ion implantation may suitably be adjusted depending on the depth of the well, the kind of ion and the like. The ion implantation may preferably be carried out in two or multiple steps at different doses and/or different acceleration energies. For example, it may be two- or multiple-step ion implantation set an implantation peak at a deeper region and a shallower region than a device isolation region generally formed in the semiconductor substrate. More specifically, the conditions are optionally selected within a dose ranging about $1\times10^{12}$ to $5\times10^{13}$ ions/cm$^2$ and an acceleration energy ranging about 20 to 1000 keV.

In the step (b), n-type impurities are implanted in the silicon film in the nMOS region of the semiconductor substrate. The conditions of the ion implantation are not particularly limited as long as the impurities are uniformly diffused only within the silicon film when annealed in a general manner in a later step, the obtained silicon film appropriately functions as a gate electrode of the nMOS transistor and the implanted impurities do not penetrate the silicon film and the gate insulating film. Specifically, where the thickness of the silicon film is within the above-mentioned range, the ion implantation is suitably carried out in a dose of about $1\times10^{15}$ to $5\times10^{15}$ ions/cm$^2$ and an acceleration energy of about 5 to 30 keV (phosphorus) or about 10 to 50 keV (arsenic).

The ion implantation is preferably performed with a mask having an opening only above the nMOS region so that the n-type impurities are implanted only in the silicon film in the nMOS region. The mask may be a resist mask formed by photolithography or a so-called hard mask made of an insulting film (e.g., a silicon oxide film, a silicon nitride film or the like).

Where the implantation of the n-type impurities in the step (b) is performed with the mask having the opening only above the nMOS region as described above, it is preferred to form a p-well by implanting p-type impurities to the semiconductor substrate using the same mask before or after the n-type impurity implantation. The p-type impurities may be boron, BF$_2$, indium or the like, among them boron is preferable. The p-well may preferably be formed by two- or multiple-step ion implantation performed under the above-mentioned conditions.

Where the n-well has not been formed yet in the pMOS region of the semiconductor substrate before the formation of the gate insulating film and the silicon film, the n-type impurities may be implanted in the step (b) into the semiconductor substrate through the silicon film and the gate insulating film using a mask having an opening only above the pMOS region to form the n-well as described above, as the step (b'). Further, the p-type impurities may be implanted to the silicon film in the pMOS region with the mask having the opening only above the pMOS region. It is preferred to perform both of the ion implantations into the semiconductor substrate for forming the n-well and into the silicon film, but only one of them may be performed. The ion implantation may be performed under the same conditions as those for the formation of the p-well and those for the n-type impurity implantation to the silicon film in the nMOS region except that different ion source is used.

In the step (b) and (b'), the ion implantation to the silicon film or the semiconductor substrate in the pMOS region and that to the silicon film or the semiconductor substrate in the nMOS region may be performed in any order. In consideration of the use of mask, the ion implantations to the silicon film and the semiconductor substrate in the pMOS region are preferably carried out successively in this order or opposite order and the ion implantations to the silicon film and the semiconductor substrate in the nMOS region are preferably carried out successively in this order or opposite order.

In the step (b), where the ion implantation of the p-type impurities is not performed into the silicon film for pMOS transistor, the p-type impurities may be introduced into the silicon film by implantation for forming source/drain regions or an LDD region described later.

In the step (c), a conductive film is formed on the silicon film. The conductive film may be a single layer or a multilayer made of, for example, mono- or polyamorphous element semiconductors (e.g., silicon, germanium and the like); compound semiconductors (e.g., GaAs, InP, ZnSe, CsS and the like); metals such as gold, platinum, silver, copper, aluminum and the like; refractory metals such as titanium, tantalum, tungsten, cobalt and the like; silicide and polyside with refractory metal; transparent conductive materials such as ITO, SnO$_2$, ZnO and the like. Among them, a film of polysilicon, amorphous silicon, silicide with refractory metal or metal is preferable. The thickness of the conductive film may be about 50 to 150 nm. The conductive film may be formed by various methods including a CVD method, a vapor deposition, an EB method, a sputtering and the like.

In the step (d) and (d'), the silicon film and the conductive film are patterned into a gate electrode. The patterning is performed by photolithography and etching using a mask of a desired configuration. The mask may be a resist mask or a hard mask as described above.

In the present invention, an insulating film may be formed after the formation of the silicon film in the step (a) and before the formation of the conductive film in the step (c) such that the thickness of the insulating film does not hinder electrical conduction between the silicon film and the conductive film. The insulating film may be a single-layered or multi-layered silicon oxide film, silicon nitride film or the like, among which the silicon oxide film is preferable. The thickness of the insulating film is not particularly limited as long as the electrical conduction between the silicon film and the conductive film is ensured and it may be about 2 nm or less, for example. The insulating film may be formed at any time, e.g., immediately after the formation of the silicon film, before the formation of the p-well, before the optional formation of the n-well or immediately before the formation of the conductive film. Alternatively it may be formed within a period from immediately after the formation of the silicon film to immediately before the formation of the conductive film. That is, the insulating film may be formed intentionally at any time by a known method such as a CVD method, a thermal oxidization or the like, or it may be a so-called spontaneous oxide film automatically generated during the steps.

After a series of the formation steps described above, source/drain regions are formed in the nMOS and pMOS regions, respectively by performing ion implantation individually to one of the nMOS and pMOS regions while covering the other and using the obtained layered gate electrode as a mask. Ion sources and conditions for the ion implantation may suitably be selected from those known in the art.

Alternatively, LDD regions may be formed in advance in the nMOS and pMOS regions, respectively by performing ion implantation individually to one of the nMOS and pMOS regions while covering the other and using the obtained layered gate electrode as a mask, and then sidewall spacers are formed. Thereafter the source/drain regions may be formed by ion implantation with the sidewall spacers and the gate electrode as a mask. Conditions of the ion implantation for forming the LDD regions and the method of forming the sidewall spacers may suitably be selected from those known in the art.

Then, the semiconductor device of the present invention is completed by optionally combining the steps of forming interlayer insulating films, forming contact holes and forming wiring layers as well as washing the semiconductor substrate surface or the resulting semiconductor substrate surface.

In the present invention, it is preferable to anneal the semiconductor substrate obtained after the step (b), (c) or (d), or after the step (b'), (c) or (d'). The annealing may be performed before, during or after any steps in any times as long as the ion implantation of the step (b) or (b') has been performed. Preferably it is performed at least once immediately after the ion implantation for forming the source/drain region. More preferably it is performed twice, i.e., once immediately after the ion implantation in the step (b) or (b'), immediately after the formation of the conductive film in the step (c) or immediately after the patterning to form the gate electrode in the step (d) or (d') and once again after the ion implantation for forming the source/drain region. The annealing may be performed under conditions suitably selected from those known in the art depending on the size of the obtained semiconductor device and the like. For example, it is performed by lamp annealing at a temperature of about 1000 to 1100° C. for 5 to 20 seconds.

Hereinafter, embodiments of the process of manufacturing the semiconductor device according to the present invention will be detailed with reference to the drawings.

Embodiment 1

As shown in FIG. 1(a), device isolation regions 11 made of a field oxide film of 350 nm thick are formed in a semiconductor substrate 10.

Figure 1B:
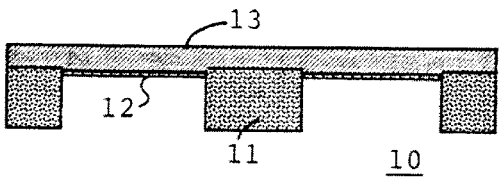

Then, a spontaneous oxide film generated on the semiconductor substrate 10 is removed to expose the surface of the semiconductor substrate 10. Then, a gate insulating film 12 made of a silicon oxide film of about 3.5 nm thick is formed on the semiconductor substrate and a polysilicon film 13 of about 100 nm thick are formed thereon as shown in FIG. 1(b).

Figure 1C:
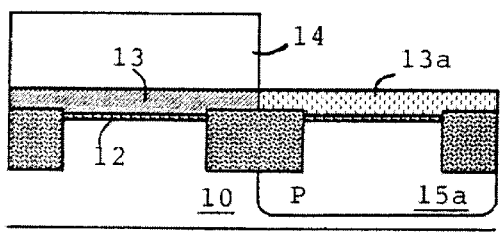

As shown in FIG. 1(c), a resist mask 14 having an opening above an nMOS region is formed by photolithography. With the resist mask 14, boron ions are implanted into the semiconductor substrate 10 through the polysilicon film 13 and the gate insulating film 13 at an acceleration energy of 300 keV, 180 keV, 95 keV and 50 keV and a dose of $1\times10^{13}$ ions/cm$^2$, $4\times10^{12}$ ions/cm$^2$, $2.5\times10^{12}$ ions/cm$^2$ and $3.5\times10^{12}$ ions/cm$^2$, respectively to form a p-well 15a. Again with the resist mask 14, phosphorus ions are implanted into the polysilicon film 13 at an acceleration energy of 10 keV and a dose of $2\times10^{15}$ ions/cm$^2$ to form an n-type polysilicon film 13a.

Figure 1D:
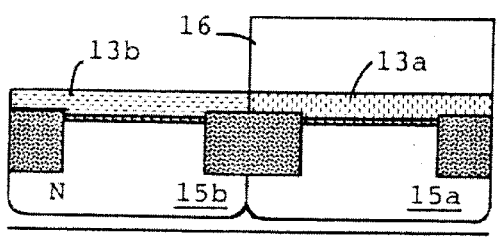

After removing the resist mask 14, a resist mask 16 having an opening above a pMOS region is formed as shown in FIG. 1(d) in the same manner as the above. With the resist mask 16, phosphorus ions are implanted into the semiconductor substrate 10 through the polysilicon film 13 and the gate insulating film 12 at an acceleration energy of 700 keV, 380 keV, 200 keV and 80 keV and a dose of $1\times10^{13}$ ions/cm$^2$, $8\times10^{12}$ ions/cm$^2$, $1.5\times10^{12}$ ions/cm$^2$ and $1.1\times10^{12}$ ions/cm$^2$, respectively to form an n-well 15b. Again with the resist mask 16, boron ions are implanted into the polysilicon film 13 at an acceleration energy of 5 keV and a dose of $2\times10^{15}$ ions/cm$^2$ to form a p-type polysilicon film 13b.

Figure 1E:
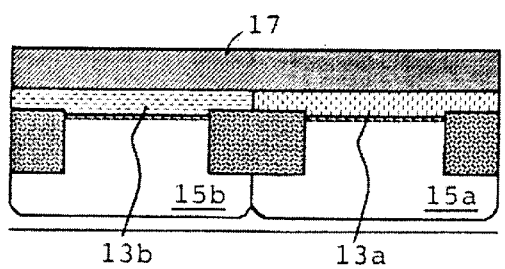

After removing the resist mask 16, the resulting semiconductor substrate 10 is washed with hydrofluoric acid to remove a spontaneous oxide film and contaminants on the n- and p-type polysilicon films 13a and 13b. Then, an amorphous silicon film 17 of about 100 nm thick is formed on the n- and p-type polysilicon films 13a and 13b as shown in FIG. 1(e). Thereafter, lamp annealing is performed at about 1050° C. for about 10 seconds to activate the thus implanted impurities.

Figure 1F:
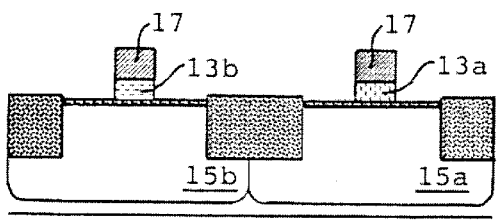

Then, as shown in FIG. 1(f), the n- and p-type polysilicon films 13a and 13b and the amorphous silicon film 17 are patterned into a desired configuration by photolithography and etching to form gate electrodes.

Figure 1G:
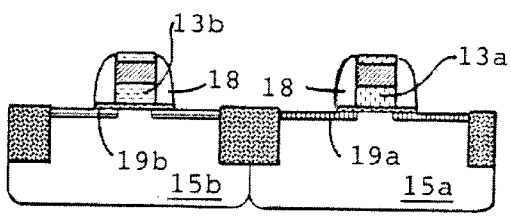

Further, ion implantation is performed to the nMOS and pMOS regions to form LDD regions 19a and 19b, respectively, as shown in FIG. 1(g). The LDD region 19a in the nMOS region is formed by implanting arsenic ions at an acceleration energy of 15 keV and a dose of $3\times10^{14}$ ions/cm$^2$. The LDD region 19b in the pMOS region is formed by implanting BF$_2$ ions at an acceleration energy of 10 keV and a dose of $1\times10^{14}$ ions/cm$^2$. At the ion implantation steps, impurities of those conductivity types are also implanted into a relatively shallow portion of the silicon film 17. Then, a silicon nitride film of about 100 nm thick is deposited on the entire surface of the thus obtained semiconductor substrate 10 and etched back to form sidewall spacers 18.

Figure 1H:
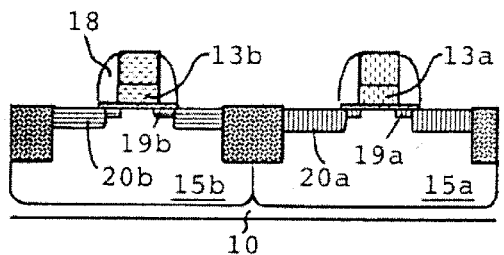

As shown in FIG. 1(h), ion implantation is performed to the nMOS and pMOS regions to form source/drain regions 20a and 20b, respectively. The source/drain region 20a in the nMOS region is formed by implanting arsenic ions at an acceleration energy of 50 keV and a dose of $2\times10^{15}$ ions/cm$^2$. The source/drain region 20b in the pMOS region is formed by implanting BF$_2$ ions at an acceleration energy of 30 keV and a dose of $1.5\times10^{15}$ ions/cm$^2$. At the ion implantation steps, impurities of those conductivity types are also implanted into a relatively deep portion of the silicon film 17.

Thereafter, lamp annealing is performed at about 1010° C. for about 10 seconds to activate the thus implanted impurities. Through the annealing, the impurities implanted in the n- and p-type polysilicon films 13a and 13b and the amorphous silicon film 17 are diffused within the gate electrodes. Since the impurities are sufficiently diffused in the gate electrodes even if the annealing is performed at low temperature for a short period of time, depletion of the gate electrodes is inhibited, and thus a shallow junction is formed and the penetration of boron ions are prevented.

Figure 1I:
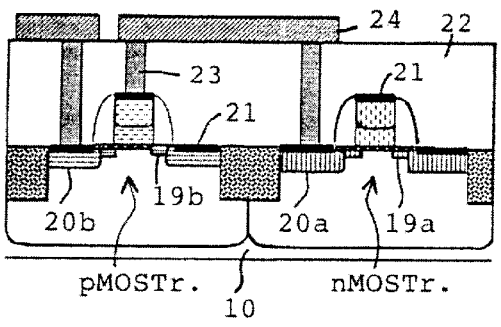

Then, a cobalt film is formed on the obtained semiconductor substrate 10 and thermally treated to form a cobalt silicide film 21 on the gate electrodes and the source/drain regions 20a and 20b as shown in FIG. 1(i). Thereafter, an interlayer insulating film 22 and contact holes are formed, and then contact plugs 23 and a wiring layer 24 are formed in a wiring step. Thus, a dual gate CMOS transistor is completed.

Embodiment 2

Figure 2A:
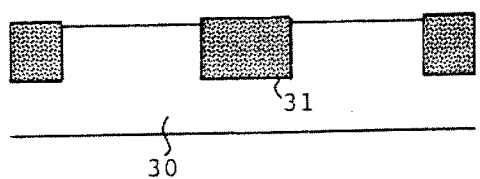
FIGS. 2(a) to 2(i) are schematic sectional views of a major part for illustrating another embodiment of a process of manufacturing a semiconductor device according to the present invention.

As shown in FIG. 2(a), device isolation regions 31 are formed in a semiconductor substrate 30 in the same manner as in Embodiment 1.

Figure 2B:
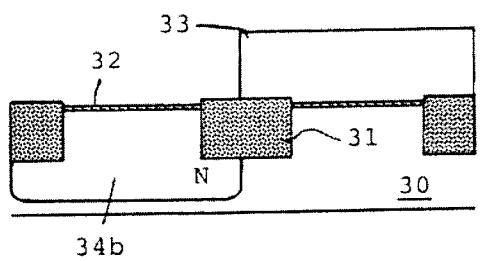

Then, a protective film 32 against the implantation made of a silicon oxide film is formed on the entire surface of the semiconductor substrate 30 as shown in FIG. 2(b). On the thus obtained semiconductor substrate 30 a resist mask 33 having an opening only above a pMOS region is formed. With the resist mask 33, phosphorus ions are implanted into the semiconductor substrate 30 at an acceleration energy of 600 keV, 300 keV, 150 keV and 40 keV and a dose of $1\times10^{13}$ ions/cm$^2$, $8\times10^{12}$ ions/cm$^2$, $1.5\times10^{12}$ ions/cm$^2$ and $1.1\times10^{13}$ ions/cm$^2$, respectively to form an n-well 34b.

Figure 2C:
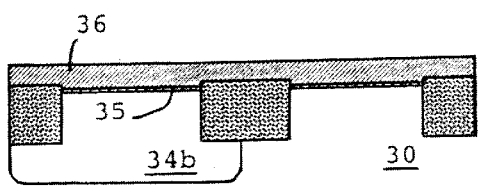

After removing the resist mask 33, the protective film 32 is removed to expose the surface of the semiconductor substrate 30 and a gate insulating film 35 made of a silicon oxide film of about 3.5 nm thick is formed thereon. Further, a polysilicon film 36 of about 50 nm thick is formed thereon as shown in FIG. 2(c).

Figure 2D:
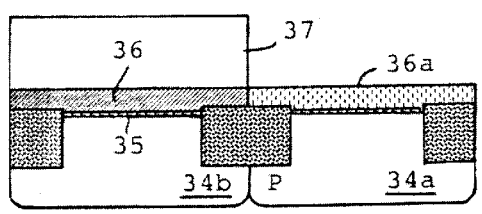

Then as shown in FIG. 2(d), a resist mask 37 having an opening only above an nMOS region is formed as described above. With the resist mask 37, boron ions are implanted into the semiconductor substrate 30 through the polysilicon film 36 and the gate insulating film 35 at an acceleration energy of 280 keV, 160 keV, 80 keV and 35 keV and a dose of $1\times10^{13}$ ions/cm$^2$, $4\times10^{12}$ ions/cm$^2$, $2.5\times10^{12}$ ions/cm$^2$ and $3\times10^{12}$ ions/cm$^2$, respectively to form a p-well 34a. Again with the resist mask 37, phosphorus ions are implanted into the polysilicon film 36 at an acceleration energy of 10 keV and a dose of $2\times10^{15}$ ions/cm$^2$ to form an n-type polysilicon film 36a.

Figure 2E:
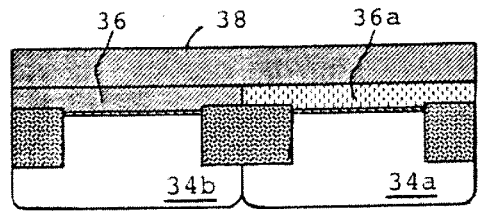

After removing the resist mask 37, the thus obtained semiconductor substrate 30 is washed with hydrofluoric acid in the same manner as in Embodiment 1. Then, an amorphous silicon film 38 of about 100 nm thick is formed on the polysilicon film 36 and the n-type polysilicon film 36a as shown in FIG. 2(e).

Figure 2F:
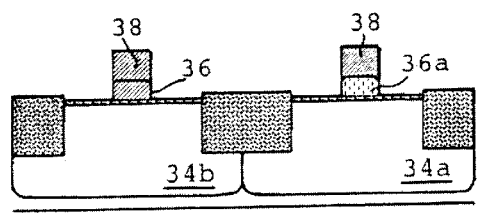

Further, as shown in FIG. 2(f), the polysilicon film 36, the n-type polysilicon film 36a and the amorphous silicon film 38 are patterned into a desired configuration by photolithography and etching to form gate electrodes.

Figure 2G:
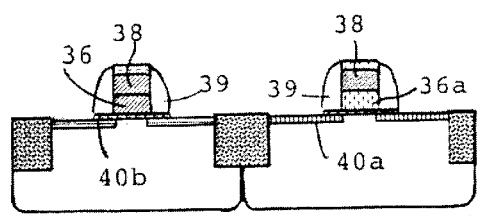

Then, ion implantation is performed to the nMOS and pMOS regions to form LDD regions 40a and 40b, respectively as shown in FIG. 2(g) in the same manner as in Embodiment 1. Thereafter, sidewall spacers 39 are formed onto the gate electrodes.

Figure 2H:
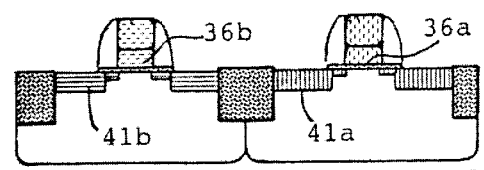

Then, ion implantation is further performed to the nMOS and pMOS regions to form source/drain regions 41a and 41b, respectively as shown in FIG. 2(h). The source/drain region 41a in the nMOS region is formed by implanting arsenic ions at an acceleration energy of 50 keV and a dose of $3\times10^{15}$ ions/cm$^2$. The source/drain region 41b in the pMOS region is formed by implanting BF$_2$ ions at an acceleration energy of 30 keV and a dose of $2\times10^{15}$ ions/cm$^2$.

Thereafter, lamp annealing is performed at about 1020° C. for about 10 seconds to activate the thus implanted impurities. As a result of the annealing, the impurities implanted in the n-type polysilicon film 36a and the amorphous silicon film 38 are diffused within the gate electrode in the nMOS region, which prevents depletion of the gate electrode. Further, boron ions implanted as impurities in the amorphous silicon film 38 in the pMOS region are sufficiently distributed within the gate electrode even if the annealing is performed at low temperature for a short period, which prevents depletion of the gate electrode. Thus, a shallow junction is obtained and penetration of boron ions are prevented.

Figure 2I:
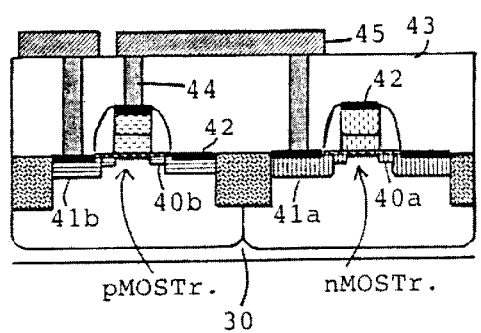
Figure 3A:
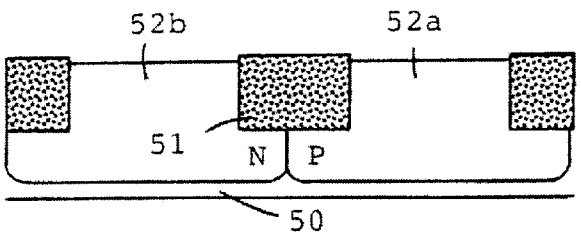
FIGS. 3(a) to 3(f) are schematic sectional views of a major part for illustrating a process of manufacturing a semiconductor device according to the prior art.
Figure 3B:
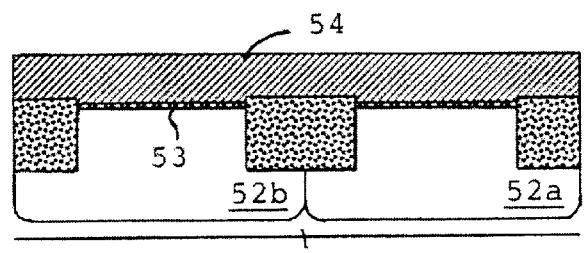
Figure 3C:
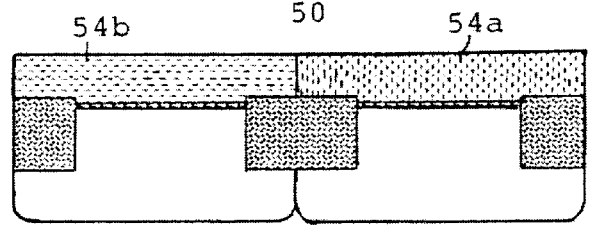
Figure 3D:
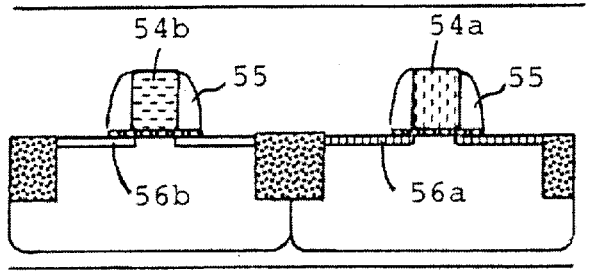
Figure 3E:
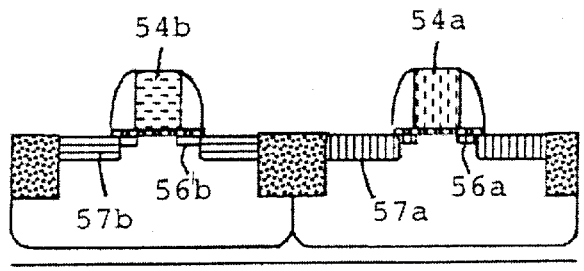
Figure 3F:
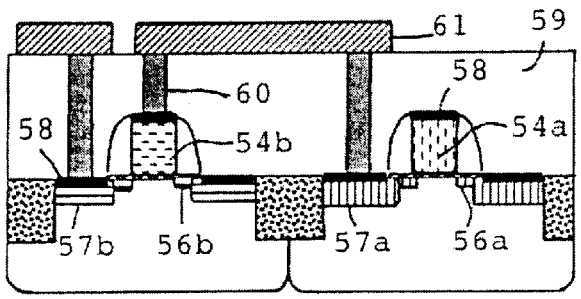

Then, a cobalt silicide film 42, an interlayer insulating film 43, contact holes, contact plugs 44 and a wiring layer 45 are formed in the same manner as in Embodiment 1 to complete a dual gate CMOS transistor as shown in FIG. 2(i).

According to the present invention, particularly in the gate electrode in the nMOS region where depletion has easily been happened, sufficient impurity concentration is maintained entirely in the gate electrode and the impurities of a sufficient amount are efficiently introduced into an interface between the gate electrode and the gate insulating film. Thus, the depletion of the gate electrode in the nMOS region is prevented while inhibiting short channel effect and reducing OFF current without multiplying particular manufacturing steps and prolongation of the steps.

Further, penetration of the p-type impurities, in particular boron ions, through the gate insulating film due to high diffusiveness of boron is prevented in the pMOS transistor. Accordingly, a miniaturized dual gate CMOS transistor of high performance and high reliability is manufactured.

That is, according to a series of steps of the present invention, impurities can be implanted in advance in a lower portion of the gate electrode. Therefore the impurities are effectively introduced at a sufficient concentration into the neighborhood of an interface between the gate insulating film and the gate electrode without being affected by the conditions of ion implantation for forming the source/drain region and annealing performed later, as well as material of the gate electrode. Thus, the depletion of the gate electrode is advantageously inhibited. Further, since the impurities can be diffused into a required portion by a thermal treatment for a relatively short period, a source/drain region of shallow junction is easily formed and the penetration of boron ions through the gate insulating film in the pMOS transistor is prevented. Therefore, the threshold value of the transistor can be controlled.

In the step (b), where the n-type impurities are implanted to the semiconductor substrate in the nMOS region with a mask having an opening only above the nMOS region before or after ion implantation to the silicon film, the mask is used for both of the ion implantation steps so that multiplication of masking steps is prevented. Further, another ion implantation for forming the well is performed after the gate insulating film is formed, which inhibits unnecessary thermal diffusion of the impurities implanted for forming the well. For example, decrease or increase in the impurity concentration at an interface between the well and the device isolation region generally formed in the semiconductor substrate are inhibited, which improves field properties.

Further, in the step (b), where the n-type impurities are implanted to the semiconductor substrate with a mask having an opening only above the pMOS region in two or multiple steps at two or more different acceleration energies and/or two or more different doses, a well of optional depth is easily formed with uniform impurity concentration and the impurity concentration of a deeper portion of the well is easily increased. This is advantageous in preventing latch-up.

Still further in the step (b), where the p-type impurities are implanted into the silicon film in the pMOS region of the semiconductor substrate before or after the n-type impurity implantation to the semiconductor substrate, a mask for the n-type impurity implantation is used also for the p-type impurity implantation. Therefore, sufficient impurity concentration is ensured entirely within the gate electrode in the pMOS region and in an interface between the gate electrode and the gate insulating film. Thus, depletion of the gate electrode in the nMOS region is prevented while inhibiting short channel effect and reducing OFF current without multiplying and lengthening particular manufacturing steps.

Where the conductive film is made of a silicide film or a metal film in the step (c), resistance at the gate electrode is easily reduced, which is advantageous to next-generation techniques.

Further, where an insulating film is formed after the formation of the silicon film in the step (a) and before the formation of the conductive film in the step (c) to have a thickness which does not hinder electrical conduction between the silicon film and the conductive film, action of fluorine which badly promotes the penetration of boron ions through the gate insulating film is inhibited, which effectively prevents the penetration of boron ions through the gate insulating film in the pMOS region.

Where the semiconductor substrate is subjected to annealing after the step (b), (c) or (d), the impurities implanted in the gate electrode are sufficiently diffused so that the depletion of the gate electrode is advantageously prevented.

What is claimed is:

1. A process of manufacturing a semiconductor device having a dual gate CMOS transistor in which an nMOS transistor in the dual gate CMOS transistor is formed by a process comprising:
   (a) forming a gate insulating film and a film comprising silicon on a semiconductor substrate;
   (b) implanting n-type impurities into the film comprising silicon in an nMOS region of the semiconductor substrate;
   (c) after implanting the n-type impurities into the film comprising silicon, forming a conductive film on the film comprising silicon; and
   (d) patterning the film comprising silicon with the n-type impurities therein and the conductive film into a gate electrode.

2. A process according to claim 1, wherein the conductive film formed in the step (c) is made of a silicide film or a metal film.

3. A process according to claim 1, wherein an insulating film having a thickness which does not prevent electrical conduction between the film comprising silicon and the conductive film is formed after the formation of the film comprising silicon in the step (a) and before the formation of the conductive film in the step (c).

4. A process according to claim 1, wherein the obtained semiconductor substrate is annealed after the step (b), (c) or (d).

5. A process according to claim 1, wherein source/drain regions are formed by an ion implantation after the step (d).

6. The process of claim 1, wherein the n-type impurities consist of phosphorous.

7. The process of claim 1, wherein the conductive film formed in (c) comprises silicon.

8. The process of claim 1, wherein the gate electrode includes only two layers, specifically the layer comprising silicon with the n-type impurities therein and the conductive film, and wherein the layer comprising silicon is pre-implanted with ions and the conductive film is not pre-implanted with ions.

9. A process of manufacturing a semiconductor device having a dual gate CMOS transistor in which an nMOS transistor in the dual gate CMOS transistor is formed by a process comprising:
   (a) forming a gate insulating film and a silicon film on a semiconductor substrate;
   (b) implanting n-type impurities into the silicon film in an nMOS region of the semiconductor substrate;
   (c) forming a conductive film on the silicon film;
   (d) patterning the silicon film and the conductive film into a gate electrode; and
   wherein in the step (b) the n-type impurities are implanted into the silicon film with a mask having an opening above the nMOS region, and p-type impurities are further implanted into the semiconductor substrate through the gate insulating film and the silicon film using the same mask before or after the n-type impurity implantation.

10. A process according to claim 9, wherein the ion implantation into the semiconductor substrate is performed using at least one of: two or more kinds of acceleration energies; and two or more kinds of doses.

11. A process of manufacturing a semiconductor device having a dual gate CMOS transistor, the method comprising:
   (a) forming a gate insulating film and a silicon film on a semiconductor substrate;
   (b') implanting n-type impurities into the silicon film in an nMOS region and p-type impurities into the silicon film in an pMOS region of the semiconductor substrate;
   (c) after implanting the n-type impurities into the silicon film, forming a conductive film on the silicon film; and
   (d') patterning the silicon film and the conductive film into gate electrodes for the nMOS and pMOS transistor.

12. A process according to claim 11, wherein in the step (b') the p-type impurities are implanted into the silicon film with a mask having an opening only above the pMOS region, and n-type impurities are further implanted into the semiconductor substrate through the gate insulating film and the silicon film using the same mask before or after the p-type impurity implantation.

13. A process according to claim 11, wherein the obtained semiconductor substrate is annealed after the step (b'), (c) or (d').

14. A process according to claim 11, wherein source/drain regions are formed by an ion implantation after the step (d').

15. The process of claim 11, wherein the conductive film formed in (c) comprises silicon.

16. The process of claim 11, wherein the gate electrode includes only two layers, specifically the layer comprising silicon with the n-type impurities therein and the conductive film, and wherein the layer comprising silicon is pre-implanted with ions and the conductive film is not pre-implanted with ions.

17. A process of manufacturing a semiconductor device having a dual gate CMOS transistor, the process comprising:
   (a) forming a gate insulating film and a silicon film on a semiconductor substrate;
   (b') implanting n-type impurities into the silicon film in an nMOS region and p-type impurities into the silicon film in a pMOS region of the semiconductor substrate;
   (c) forming a conductive film on the silicon film;
   (d') patterning the silicon film and the conductive film into gate electrodes for the nMOS and pMOS transistor; and
   wherein in the step (b') the n-type impurities are implanted into the silicon film with a mask having an opening only above the nMOS region, and p-type impurities are further implanted into the semiconductor substrate through the gate insulating film and the silicon film using the same mask before or after the n-type impurity implantation.

18. A process according to claim 17, wherein the ion implantation into the semiconductor substrate is performed using at least one of: two or more kinds of acceleration energies; and two or more kinds of doses.

* * * * *